United States Patent
Lim et al.

(10) Patent No.: US 10,189,367 B2
(45) Date of Patent: Jan. 29, 2019

(54) ELECTRIC VEHICLE QUICK CHARGE CONTROL APPARATUS

(71) Applicant: LG INNOTEK CO., LTD., Seoul (KR)

(72) Inventors: Myung Keun Lim, Seoul (KR); Do Hyeong Kim, Seoul (KR); Kwang Seob Shin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 46 days.

(21) Appl. No.: 15/327,431

(22) PCT Filed: Jul. 13, 2015

(86) PCT No.: PCT/KR2015/007247
§ 371 (c)(1),
(2) Date: Jan. 19, 2017

(87) PCT Pub. No.: WO2016/017963
PCT Pub. Date: Feb. 4, 2016

(65) Prior Publication Data
US 2017/0158079 A1    Jun. 8, 2017

(30) Foreign Application Priority Data
Aug. 1, 2014    (KR) .................. 10-2014-0098925

(51) Int. Cl.
*H02J 7/00* (2006.01)
*B60L 11/18* (2006.01)
(Continued)

(52) U.S. Cl.
CPC ........... *B60L 11/1861* (2013.01); *B60L 11/18* (2013.01); *B60L 11/1879* (2013.01); *G01R 31/3606* (2013.01); *G01R 31/3634* (2013.01); *G01R 31/44* (2013.01); *H01M 10/48* (2013.01); *H02J 7/04* (2013.01); *H01M 2220/20* (2013.01)

(58) Field of Classification Search
USPC ....................................................... 320/148
See application file for complete search history.

(56) References Cited

U.S. PATENT DOCUMENTS

2011/0273139 A1* 11/2011 Hofheinz ............ B60L 3/0023
320/109
2011/0285345 A1* 11/2011 Kawai ................. B60L 11/1825
320/107

(Continued)

*Primary Examiner* — Mohammed Alam
(74) *Attorney, Agent, or Firm* — LRK Patent Law Firm

(57) ABSTRACT

An electric vehicle quick charge control apparatus includes: a voltage detection unit for detecting the amplitude of a direct current voltage inputted from a charging station; a quick charging unit receiving a power applied from the charging station so as to quickly charge an electric vehicle battery and monitor the status of charge (SOC) information of the battery; and an integrated power control unit for dually controlling the quick charge of the battery on the basis of first discriminant information discriminated by determining the status of charge of the battery from the SOC information of the battery transmitted from the quick charging unit and second discriminant information discriminated by determining the status of charge of the battery from a detected voltage transmitted from the voltage detection unit.

7 Claims, 5 Drawing Sheets

(51) Int. Cl.
*H02J 7/04* (2006.01)
*G01R 31/36* (2006.01)
*H01M 10/48* (2006.01)
*G01R 31/44* (2006.01)

(56) References Cited

U.S. PATENT DOCUMENTS

2016/0114692 A1* 4/2016 Tripathi ................ H02J 7/0021
   320/109
2017/0158079 A1* 6/2017 Lim .................... B60L 11/1861

* cited by examiner

FIG. 2

| Input Voltage | | Unit | Detection Voltage | | |
|---|---|---|---|---|---|
| | | Voltage | Minimum | | Maximum |
| DC+ | -30 | V | 0.5 | 0.52 | |
| | 0 | V | | 0.73 | |
| | 50 | V | | 1.04 | |
| | 100 | V | | 1.36 | |
| | 150 | V | | 1.7 | |
| | 200 | V | | 2 | |
| | 250 | V | | 2.34 | |
| | 300 | V | | 2.65 | |
| | 350 | V | | 3 | |
| | 400 | V | | 3.3 | |
| | 450 | V | | 3.63 | |
| | 500 | V | | 3.93 | |
| | 550 | V | | 4.3 | 4.5 |
| DC- | 30 | V | 0.5 | 0.538 | |
| | 0 | V | | 0.73 | |
| | -50 | V | | 1.08 | |
| | -100 | V | | 1.35 | |
| | -150 | V | | 1.68 | |
| | -200 | V | | 1.99 | |
| | -250 | V | | 2.34 | |
| | -300 | V | | 2.67 | |
| | -350 | V | | 3 | |
| | -400 | V | | 3.3 | |
| | -450 | V | | 3.62 | |
| | -500 | V | | 4 | |
| | -550 | V | | 4.3 | 4.5 |

ELECTRIC VEHICLE QUICK CHARGE CONTROL APPARATUS

CROSS-REFERENCE TO RELATED APPLICATION

The present application claims priority to Korean Application No. 10-2014-0098925, filed Aug. 1, 2014, the disclosure of which is incorporated by reference herein in its entirety.

BACKGROUND OF THE INVENTION

1. Technical Field

The present disclosure relates to a quick charge control apparatus for an electric vehicle. In particular, the present disclosure relates to an electric vehicle quick charge control apparatus that can determine charging status based on SOC (status of charge) information transmitted from the quick charger, and at the same time, can provide dual stability for the control of quick charging of a battery by determining charging status of the battery with reference to detection voltage detected by a voltage detector.

2. Description of Related Art

An electric vehicle refers to a car which runs using electricity. The electric vehicle generally can be categorized into two types, i.e., one is a pure electric vehicle (Battery Powered Electric Vehicle) and the other is a hybrid electric vehicle (Hybrid Electric Vehicle). The pure electric vehicle uses only electricity to run, which is generally called as an electric vehicle. The hybrid electric vehicle uses both electricity and fossil fuel to run. The electric vehicle is provided with a battery for supplying electricity for driving. In particular, in the case of the plug-in type hybrid electric vehicle among the pure electric vehicle and the hybrid electric vehicle, the battery is charged by the current supplied from the external power source to drive the electric motor.

Methods to charge an electric vehicle can be categorized into quick charging and slow charging. In the case of quick charging, the battery is charged by the direct current supplied from the charger. In the case of slow charging, the battery is charged by the alternating current supplied from the charger. Therefore, the charger used in the quick charging is called a quick charger or a direct current charger, and the charger used in the slow charging is called a slow charge or an alternating current charger.

The slow charging is performed in such way that the battery of the electric vehicle is charged by supplying an alternating current 220V to the electric vehicle via a cable connected to the charger, where an approximately 3 kW charger mounted on the vehicle converts the applied alternating current 220V to the direct current to charge the battery. The slow charging generally takes 8~10 hours depending on the battery capacity, where a charger having a power capacity of about 6~7 kW is mainly installed.

The quick charging is performed in such way that the charger receives three-phase alternating current 380V while exchanging control signals with the vehicle, convert the alternating current into the direct current, and variably supplies the direct current 100~550V to charge the battery of the electric vehicle. The quick charging is a high-pressure and high-capacity charging method that consumes less time. In general, a 50 kW class charger is installed, because the charger is required to supply direct current electric power having high capacity.

In the case of quick charging, as a high-capacity DC power is supplied for charging the battery, the charging voltage and current are required to be monitored in real time for preventing overcharge and undercharge, thereby to properly control the battery charge.

SUMMARY

An object of the present disclosure is to provide, in whole or in part, to an electric vehicle quick charge control apparatus that can determine charging status based on SOC (status of charge) information transmitted from the quick charger, and at the same time, can provide dual stability for the control of quick charging of a battery by determining charging status of the battery with reference to detection voltage detected by a voltage detector.

Technical tasks of the present disclosure are not limited to the above-mentioned technical tasks. Other technical tasks which are not mentioned may be clearly understandable for persons who skilled in the art of the present disclosure from the following description.

In order to achieve at least the above objects, in whole or in part, and in accordance with the purposes of the present disclosure, as embodied and broadly described, and in one general aspect of the present disclosure, there is provided an electric vehicle quick charge control apparatus, comprising: a voltage detector configured to detect a level of DC (direct current) voltage inputted from a charging station; a quick charger configured to monitor SOC (status of charge) information of a battery of an electric vehicle, while performing quick charging for the battery of the electric vehicle by being supplied with electric power applied by the charging station; an integrated power control unit configured to dually control quick charging of the battery, based on first determination information determined by determining charging status of the battery from the SOC information delivered from the quick charger and second determination information determined by determining charging status of the battery from detection voltage delivered from the voltage detector.

In some exemplary embodiments, the electric vehicle quick charge control apparatus may further comprise: a data storage configured to store charging status determination information for determining charging status of the battery in response to a level of detection voltage detected by the voltage detector.

In some exemplary embodiments, the charging status determination information may be set to determine a charging status of the battery by corresponding information of input voltage applied by the charging station for quick charging of the battery to information of detection voltage detected by the voltage detector.

In some exemplary embodiments, the integrated power control unit may estimate a level of the input voltage corresponding to a level of the detection voltage detected by the voltage detector by referring to charging status determination information stored in the data storage, and may determine a charging status of the battery based on the estimated level of the input voltage.

In some exemplary embodiments, the voltage detector may comprise a comparison circuit configured to output a voltage of 0V~5V using a 5V reference voltage in response to an input voltage difference, by receiving the DC voltage inputted from the charging station via two input terminals, and by comparing the input voltage difference between input voltages of the two input terminals.

In some exemplary embodiments, the integrated power control unit may compares the first determination information with the second determination information, then, may continue or terminate charging of the battery depending on charging status information by the first determination information upon determining that the first determination information is consistent with the second determination information, and may terminate charging of the battery upon determining that the first determination information is consistent with the second determination information.

Exemplary embodiments of the present disclosure have advantageous effects in that a dual stability for the control of quick charging of a battery can be provided, because the electric vehicle quick charge control apparatus according to an exemplary embodiment of the present disclosure can determine charging status based on SOC information transmitted from the quick charger, and at the same time, can determine charging status of the battery with reference to detection voltage detected by a voltage detector.

BRIEF DESCRIPTION OF DRAWINGS

FIG. 2 is a view showing the result of voltage simulation for determining charging status of an electric vehicle quick charge control apparatus according to an exemplary embodiment of the present disclosure.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, the described aspect is intended to embrace all such alterations, modifications, and variations that fall within the scope and novel idea of the present disclosure.

Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

That is, definitions of the terms "include" and "comprise," as well as derivatives thereof, may mean inclusion without limitation. In the definitions, the power failure and the (momentary) voltage dip may be interchangeably used.

Figure 1:
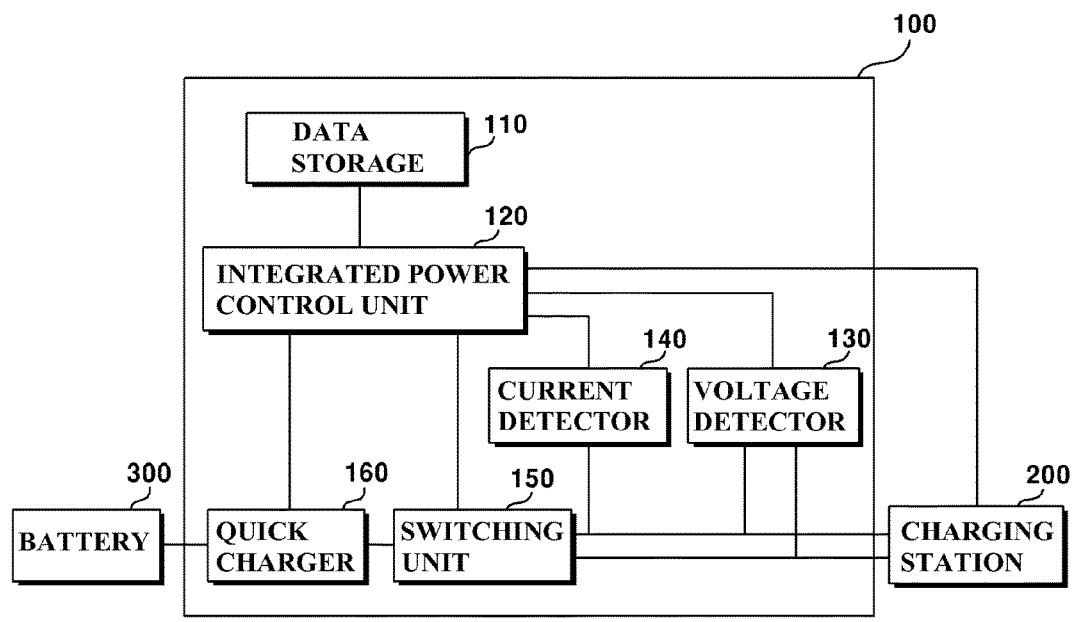
FIG. 1 is a block diagram illustrating an electric vehicle quick charge control apparatus according to an exemplary embodiment of the present disclosure.

FIG. 1 is a block diagram illustrating an electric vehicle quick charge control apparatus according to an exemplary embodiment of the present disclosure.

Referring to FIG. 1, the electric vehicle quick charge control apparatus according to an exemplary embodiment of the present disclosure (100) may perform quick charging of the battery (300) by being supplied with a high-voltage direct current from the charging station (200).

The quick charge control apparatus (100) may comprise a data storage (110), a voltage detector (120), a current detector (130), an integrated power control unit (140), a switching unit (150), and a quick charger (160).

The data storage (110) may store charging status determination information for determining charging status in response to a level of detection voltage detected by the voltage detector (120).

The charging status determination information may be set to determine a charging status of the battery, by corresponding information of input voltage applied by the charging station for quick charging of the battery to information of detection voltage detected by the voltage detector (120).

As illustrated in FIG. 2, the charging status determination information may be set based on the result of voltage simulation for determining charging status. In FIG. 2, the detection voltages are corresponding to respective levels of input voltages. Thus, the level of input voltage in a certain moment may be estimated based on the level of detection voltage detected by the voltage detector (120). The charging status may be set as either one of an undercharged status, a normally charged status, and an overcharged status, depending on the level of input voltage.

For example, the charging status determination information may be set based on the simulation result illustrated in FIG. 2. That is, the charging status determination information may be set as an undercharged status when the detection voltage monitored by the voltage detector (120) is less than 0.5V. The charging status determination information may be set as a normally charged status when the detection voltage monitored by the voltage detector (120) is within a range above 0.5V and under 4.5V. The charging status determination information may be set as an overcharged status when the detection voltage monitored by the voltage detector (120) is more than 4.5V.

The voltage detector (120) may detect a level of direct voltage inputted from the charging station (200). For example, the voltage detector (120) may be configured to output a detection voltage within a range of 0V~5V. For this purpose, the voltage detector (120) may be implemented as a comparison circuit configured to receive 100~550V DC voltage inputted from the charging station (200) via two input terminals, then to compare an input voltage difference between two input voltages of the two input terminals, and to output a voltage of 0V~5V using a 5V reference voltage in response to the input voltage difference.

The current detector (130) may comprise a current sensor for detecting electric current inputted from the charging station (200).

The integrated power control unit (140) may communicate with the charging station (200) for battery charging, while monitoring the voltage detector (120), the current detector (130), and the quick charger (160). Thereby, the integrated power control unit (140) may be supplied with electric power for charging the battery from the charging station (200), and may supply the electric power to the quick charger (160).

The integrated power control unit (140) may estimate a level of input voltage currently being inputted from the charging station (200), with reference to the voltage information table stored in the data storage (110). Further, the integrated power control unit (140) may determine a current charging stage based on the level of input voltage, among the entire charging stages.

The integrated power control unit (140) may determine a charging status, by monitoring the detection voltage outputted from the voltage detector (120).

For example, the integrated power control unit (140) may determine the charging status as an undercharged status when the monitored detection voltage is less than 0.5V, as a normally charged status when the monitored detection voltage is within a range above 0.5V and under 4.5V, and as an overcharged status when the monitored detection voltage is more than 4.5V.

The integrated power control unit (140) may display the charging status information depending on the determined charging status. Display of the charging status information may be performed by a display device or an audio device.

The integrated power control unit (140) may generate a switching control signal based on the determined charging status, and may output the switching control signal to the switching unit (150). For example, the integrated power control unit (140) may output a switching control signal to terminate charging, when the determined charging status in an overcharged status. The integrated power control unit (140) may output a switching control signal to continue charging, when the determined charging status in an undercharged status or in a normally charged status.

The integrated power control unit (140) may determine charging status of the battery based on SOC (status of charge) information transferred from the quick charger (160).

For example, the integrated power control unit (140) may compare SOC information of the battery with the predetermined reference SOC information, thereby to determine whether charging status of the battery is in an undercharged status, in a normally charged status, or in an overcharged status.

The integrated power control unit (140) may compare charging status of the battery determined based on the SOC information transferred from the quick charger (160) with charging status of the battery determined based on detection voltage detected by the voltage detector (120), and then, may control the switching unit (150) depending on charging status information determined based on the SOC information to continue or terminate charging of the battery, when the charging status of the battery determined based on the SOC information transferred from the quick charger (160) is consistent to the charging status of the battery determined based on detection voltage detected by the voltage detector (120). Meanwhile, the integrated power control unit (140) may control the switching unit (150) to terminate charging of the battery, when the charging status of the battery determined based on the SOC information transferred from the quick charger (160) is not consistent to the charging status of the battery determined based on detection voltage detected by the voltage detector (120).

It may be an effective safety means against error occurrence in the quick charger (160) to terminate charging of the battery, when the charging status of the battery determined based on the SOC information transferred from the quick charger (160) is not consistent to the charging status of the battery determined based on detection voltage detected by the voltage detector (120). That is, there is probability where the SOC information may be distorted by any failure situation including the error occurrence in the quick charger (160). Therefore, if it is not checked whether a failure occurs in the quick charger (160) even though the failure actually occurs in the quick charger (160), the failure may expand up to the integrated power control unit (140) and the battery may be damaged as well.

Therefore, the integrated power control unit (140) may determine charging status based on SOC information transmitted from the quick charger (140), and at the same time, may determine charging status of the battery with reference to detection voltage detected by a voltage detector (120). Thereby, the integrated power control unit (140) may provide dual stability for the control of quick charging of the battery.

The integrated power control unit (140) may generate charging status notification information for notifying charging status in response to the determined charging status. Therefore, the integrated power control unit (140) may generate notification information such as undercharged status, normally charged status, overcharged status, and charging termination status.

The integrated power control unit (140) may generate a switching control signal to continue or to terminate charging of the battery, depending on the determined charging status. Then, the integrated power control unit (140) may output the switching control signal.

The switching unit (150) may transfer electric power applied from the charging station (200) to the quick charger (160) or block the electric power, by performing a switching action depending on the switching control signal.

The quick charger (160) may be supplied with electric power applied from the charging station (200) to perform quick charging for the battery.

The quick charger (160) may monitor SOC information of the battery while performing the quick charging for the battery, and may transfer the SOC information to the integrated power control unit (140).

Figure 3:
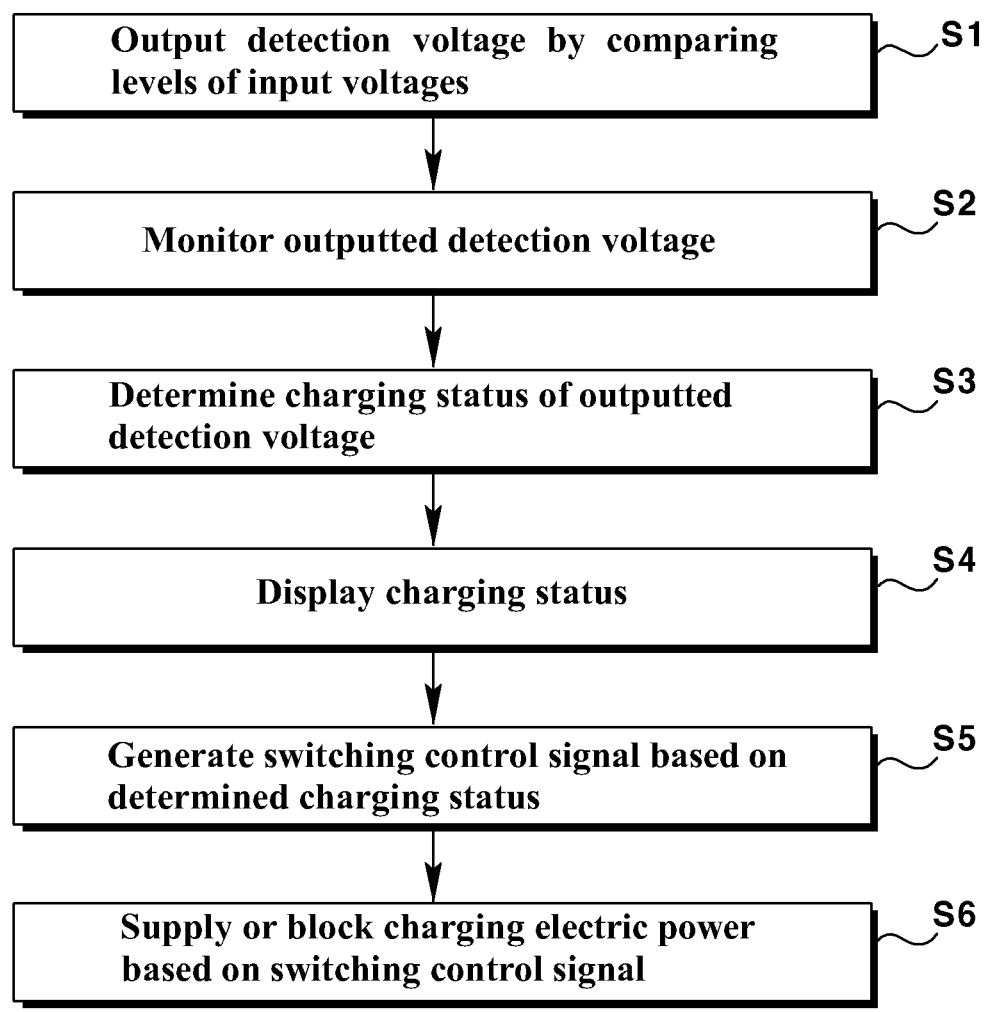
FIG. 3 is a flow chart illustrating a quick charging method of an electric vehicle according to an exemplary embodiment of the present disclosure.

FIG. 3 is a flow chart illustrating a quick charging method of an electric vehicle according to an exemplary embodiment of the present disclosure.

Referring to FIG. 3, the voltage detector (120) may output detection voltage by comparing levels of input voltages inputted via two terminals (S1). Here, the level of detection voltage outputted from the voltage detector (120) may be within a range of 0V~5V.

The integrated power control unit (140) may monitor the detection voltage outputted from the voltage detector (120) (S2).

The integrated power control unit (140) may determine charging status of the detection voltage outputted from the voltage detector (120) (S3). For example, the integrated power control unit (140) may determine the charging status as an undercharged status when the monitored detection voltage is less than 0.5V, as a normally charged status when the monitored detection voltage is within a range above 0.5V and under 4.5V, and as an overcharged status when the monitored detection voltage is more than 4.5V.

The integrated power control unit (140) may display the charging status information depending on the determined charging status (S4). Display of the charging status information may be performed by a display device or an audio device.

The integrated power control unit (140) may generate a switching control signal based on the determined charging status, and may output the switching control signal to the switching unit (150) (S5).

The integrated power control unit (140) may output a switching control signal to terminate charging, when the determined charging status in an overcharged status.

The integrated power control unit (140) may output a switching control signal to continue charging, when the determined charging status in an undercharged status or in a normally charged status.

The switching unit (150) may supply electric power applied from the charging station (200) to the quick charger (160) or block the electric power (S6).

Figure 4:
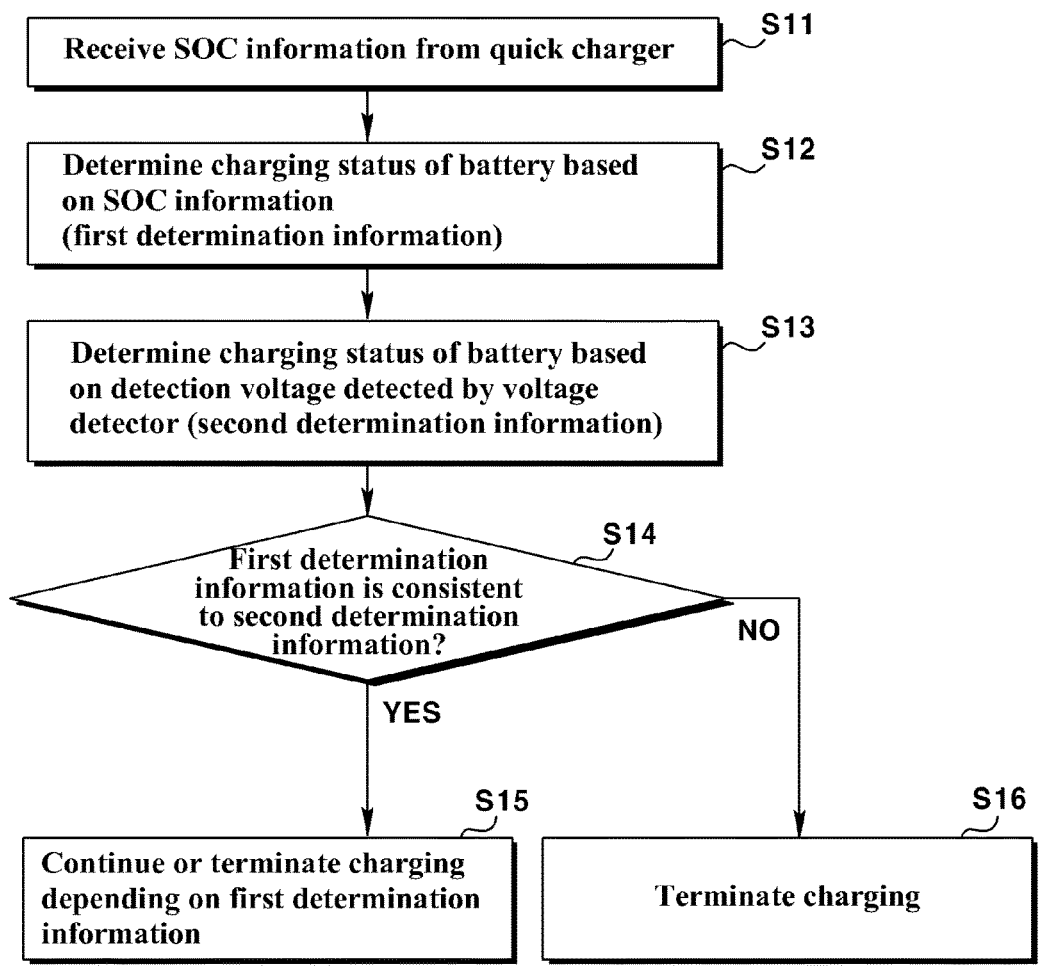
FIG. 4 is a flow chart illustrating a quick charging method of an electric vehicle according to an exemplary embodiment of the present disclosure.

FIG. 4 is a flow chart illustrating a quick charging method of an electric vehicle according to an exemplary embodiment of the present disclosure.

Referring to FIG. 4, the integrated power control unit (140) may receive SOC (status of charge) information of the battery from the quick charger (160) (S11). The integrated power control unit (140) may determine charging status of the battery based on the SOC transmitted from the quick charger (160) (S12). Here, the determined charging status information of the battery is referred to as first determination information.

The integrated power control unit (140) may compare SOC information transmitted from the quick charger (160) with the predetermined reference SOC information, thereby to determine whether charging status of the battery is in an undercharged status, in a normally charged status, or in an overcharged status.

The integrated power control unit (140) may determine charging status of the battery based on detection voltage detected by the voltage detector (120) (S13).

The integrated power control unit (140) may determine whether the charging status of the battery determined based on the SOC information transmitted from the quick charger (160) (first determination information) is consistent to the charging status of the battery determined based on the detection voltage detected by the voltage detector (12) (second determination information) (S14).

Upon determining that the first determination information is consistent to the second determination information in step S14, the integrated power control unit (140) may control the switching unit (150) depending on the first determination information determined based on the SOC information transferred from the quick charger (160) to continue or to terminate charging of the battery (S15).

Upon determining that the first determination information is not consistent to the second determination information in step S14, the integrated power control unit (140) may control the switching unit (150) to terminate charging of the battery (S16).

Figure 5:
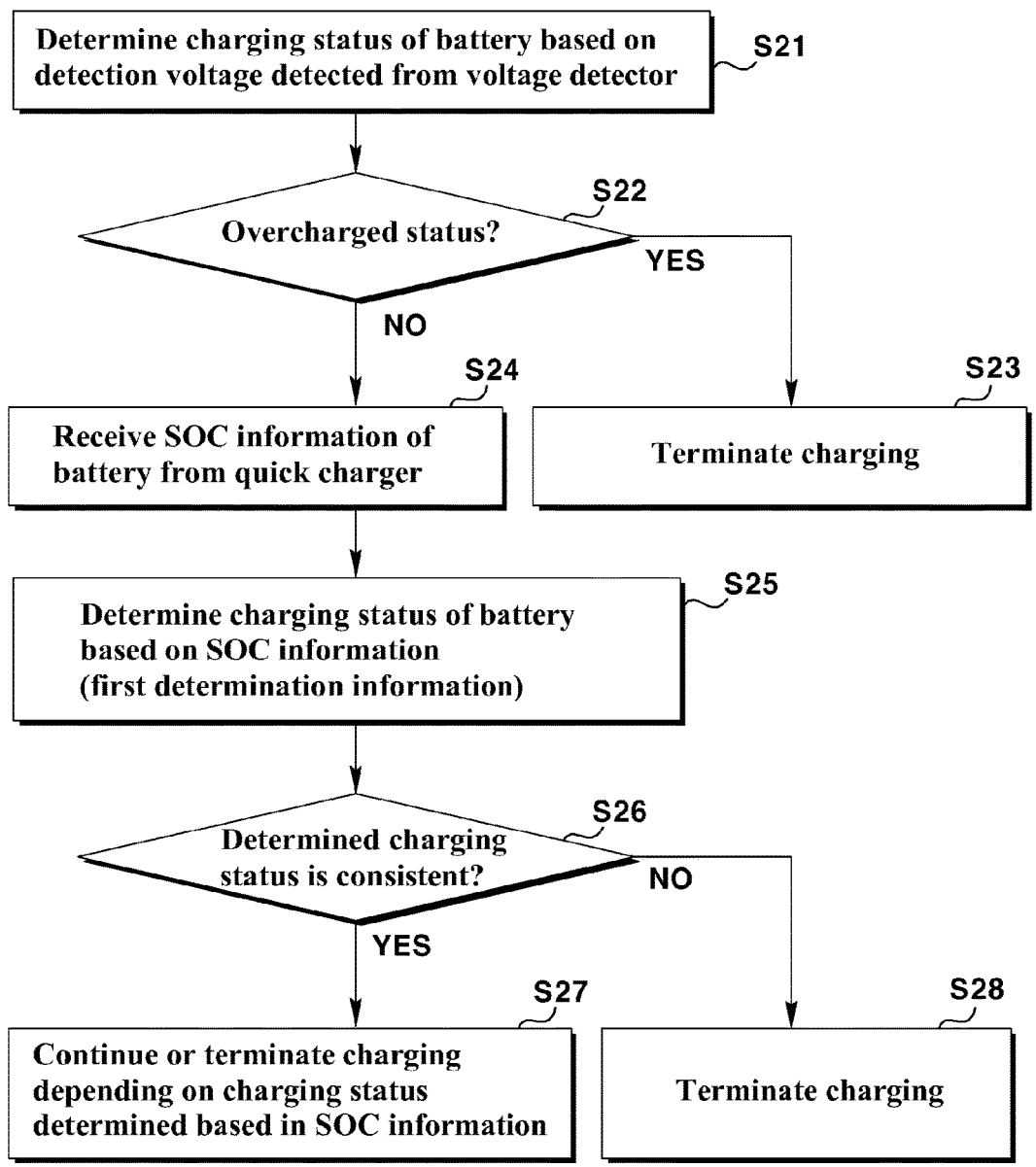
FIG. 5 is a flow chart illustrating a quick charging method of an electric vehicle according to an exemplary embodiment of the present disclosure.

FIG. 5 is a flow chart illustrating a quick charging method of an electric vehicle according to an exemplary embodiment of the present disclosure.

Referring to FIG. 5, the integrated power control unit (140) may determine charging status of the battery based on the detection voltage detected by the voltage detector (120) (S21).

The integrated power control unit (140) may determine whether the charging status of the battery determined based on the detection voltage detected by the voltage detector (120) is an overcharged status (S22).

Upon determining that the charging status of the battery is an overcharged status, the integrated power control unit (140) may control the switching unit (150) to terminate charging of the battery (S23).

The integrated power control unit (140) may receive the SOC (status of charging) information from the quick charger (S24).

The integrated power control unit (140) may determine the charging status of the battery based on the SOC information received from the quick charger (S25).

The integrated power control unit (140) may compare SOC information of the battery with the predetermined reference SOC information, thereby to determine whether the charging status of the battery is in an undercharged status, in a normally charged status, or in an overcharged status.

The integrated power control unit (140) may determine whether the charging status of the battery determined based on the SOC information transmitted from the quick charger (160) is consistent to the charging status of the battery determined based on the detection voltage detected by the voltage detector (12) (S26).

Upon determining that the first determination information is consistent to the second determination information in step S26, the integrated power control unit (140) may control the switching unit (150) depending on the charging status of the battery determined based on the SOC information transferred from the quick charger (160) to continue or to terminate charging of the battery (S27).

Upon determining that the first determination information is not consistent to the second determination information in step S26, the integrated power control unit (140) may control the switching unit (150) to terminate charging of the battery (S28).

Although the present disclosure has been described in detail with reference to the foregoing embodiments and advantages, many alternatives, modifications, and variations will be apparent to those skilled in the art within the metes and bounds of the claims. Therefore, it should be understood that the above-described embodiments are not limited by any of the details of the foregoing description, unless otherwise specified, but rather should be construed broadly within the scope as defined in the appended claims and equivalents thereof as well.

The invention claimed is:

1. An electric vehicle quick charge control apparatus, comprising:
   a voltage detector configured to detect a level of DC (direct current) voltage of input voltage inputted from a charging station;
   a quick charger configured to monitor SOC (status of charge) information of a battery of an electric vehicle, while performing quick charging for the battery of the electric vehicle by being supplied with electric power applied by the charging station; and
   an integrated power control unit configured to dually control quick charging of the battery based on first determination information and second determination information,
   the first determination information being obtained by determining charging status of the battery from the SOC information delivered from the quick charger directly connected to the battery, and
   the second determination information being obtained by determining charging status of the battery from the input voltage inputted from the charging station determined by using detection voltage delivered from the voltage detector,
   wherein the integrated power control unit terminates charging of the battery when the charging status based on the first determination information is different from the charging status based on the second determination information.

2. The electric vehicle quick charge control apparatus of claim 1, further comprising:
   a data storage configured to store charging status determination information for determining charging status of the battery in response to a level of detection voltage detected by the voltage detector.

3. The electric vehicle quick charge control apparatus of claim 2, wherein the charging status determination information is set to determine the charging status of the battery by corresponding information of the input voltage applied by the charging station for quick charging of the battery to information of the, detection voltage detected by the voltage detector.

4. The electric vehicle quick charge control apparatus of claim 3, wherein the integrated power control unit estimates a level of the input voltage corresponding to a level of the detection voltage detected by the voltage detector by referring to the charging status determination information stored in the data storage, and determines the charging status of the battery based on the estimated level of the input voltage.

5. The electric vehicle quick charge control apparatus of claim 1, wherein the voltage detector comprises:
a comparison circuit configured to output a voltage of 0V~5V using a 5V reference voltage in response to an input voltage difference, by receiving the DC voltage inputted from the charging station via two input terminals and comparing the input voltage difference between input voltages of the two input terminals.

6. The electric vehicle quick charge control apparatus of claim 1,
wherein the integrated power control unit compares the first determination information with the second determination information,
wherein when the first determination information is determined to be consistent with the second determination information, the integrated power control unit continues or terminates charging of the battery depending on charging status information based on the first determination information, and
wherein when the first determination information is determined to be not consistent with the second determination information, the integrated power control unit terminates charging of the battery upon.

7. The electric vehicle quick charge control apparatus of claim 1, wherein the integrated control unit determines the charging status of the battery based on the detection voltage detected by the voltage detector, and terminates charging of the battery upon determining that the charging status of the battery determined based on the detection voltage detected by the voltage detector is in an overcharged status.

* * * * *